(12) United States Patent
Pidutti et al.

(10) Patent No.: US 10,622,912 B2
(45) Date of Patent: Apr. 14, 2020

(54) RECTIFIER DEVICE WITH CLAMPING CIRCUIT

(71) Applicant: Infineon Technologies AG, Neubiberg (DE)

(72) Inventors: Albino Pidutti, Villach (AT); Damiano Gadler, Klagenfurt (AT); Ioannis Pachnis, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/363,872

(22) Filed: Mar. 25, 2019

(65) Prior Publication Data

US 2019/0334451 A1    Oct. 31, 2019

(30) Foreign Application Priority Data

Apr. 27, 2018 (DE) .......................... 10 2018 110 292

(51) Int. Cl.
*H02M 7/219* (2006.01)
*H02M 1/32* (2007.01)
(Continued)

(52) U.S. Cl.
CPC .......... *H02M 7/219* (2013.01); *G01R 19/165* (2013.01); *G05F 3/262* (2013.01); *H02M 2001/0003* (2013.01)

(58) Field of Classification Search
CPC ........ H02M 7/217; H02M 7/219; H02M 1/32; H02M 7/00; H02M 7/02; H02M 7/155
See application file for complete search history.

(56) References Cited

U.S. PATENT DOCUMENTS 5,079,608 A * 1/1992 Wodarczyk ......... H01L 27/0251
257/355
10,075,011 B2    9/2018 Mehringer
(Continued)

FOREIGN PATENT DOCUMENTS

DE    102015202440 A1    8/2016
DE    102017126871 A1    6/2018

OTHER PUBLICATIONS

"Ideal Diode Bridge Controller," LT4320/Lt4320-1, Linear Technology, accessed from www.linear.com/LT4320, 2013 14 pp.
(Continued)

*Primary Examiner* — Gary L Laxton
(74) *Attorney, Agent, or Firm* — Shumaker & Sieffert, P.A.

(57) ABSTRACT

A rectifier device includes a first transistor having a load current path and a diode connected in parallel to the load current path between an anode terminal and a cathode terminal. An alternating input voltage is operably applied between the anode terminal and the cathode terminal. A control circuit is coupled to a gate terminal of the first transistor and configured to switch the first transistor on for an on-time period, during which the diode is forward biased. A clamping circuit is coupled to the gate terminal of the first transistor and configured to at least partly switch on the first transistor while the diode is reverse biased and when the level of the alternating input voltage reaches a clamping voltage. The clamping circuit includes an additional circuit coupled between the cathode terminal and the gate terminal and configured to provide a voltage dependent on a load current.

23 Claims, 6 Drawing Sheets

(51) Int. Cl.
*G01R 19/165* (2006.01)
*G05F 3/26* (2006.01)
*H02M 1/00* (2006.01)

(56) References Cited

U.S. PATENT DOCUMENTS

2008/0291699 A1* 11/2008 Sells ................ H02M 7/219
363/17
2011/0199799 A1  8/2011 Hui et al.
2018/0167000 A1  7/2018 Pidutti et al.

OTHER PUBLICATIONS

"Z-Diode," Wikipedia, the Free Encyclopedia, last edited on Jan. 2018, accessed on or about Apr. 30, 2019, 6 pp.
Office Action, in the German language, from counterpart German Application No. 102018110292.5, dated Apr. 30, 2019, 8 pp.

* cited by examiner

RECTIFIER DEVICE WITH CLAMPING CIRCUIT

This Application claims priority to German Application Number 102018110292.5, filed Apr. 27, 2018, the entire content of which is incorporated herein by reference.

TECHNICAL FIELD

The invention relates to the field of power supplies, in particular to rectifier circuits and devices and related methods and devices.

BACKGROUND

In an electric power grid electricity is, for various reasons, usually distributed to customers in the form of alternating current (AC). Also alternators are used, for example, in automobiles to generate alternating current. In many applications, alternating current must be converted into direct current (DC) in order to provide a DC supply for electronic circuits or other devices that need a DC supply. This conversion process is referred to as rectification. The standard components used to build a rectifier are silicon diodes. Several types of rectifiers exists. One common type is a single-phase full-wave rectifier that is usually built using four diodes connected in a bridge configuration (a so-called Graetz bridge). As a side note, it should be mentioned that the alternating voltage provided by an electric power grid (e.g. 120 or 230 volts) is usually transformed to lower voltages using transformers before being rectified. In the automotive sector, alternators usually generate multiple-phase output voltages, and, for example, a three-phase full-wave rectifier includes six diodes. Further, rectifier diodes may also be used, for example, in (DC/DC or AC/DC) converters.

Silicon diodes have forward voltages of approximately 0.6 to 0.7 volts. Schottky and germanium diodes have slightly lower forward voltages of approximately 0.3 volts. The forward voltage of a pn-junction (i.e. of a diode) depends on the semiconductor material and can therefore be practically regarded as a constant parameter for a specific semiconductor manufacturing technology, which normally is based on silicon. It is understood, however, that the actual forward voltage is temperature dependent. That is, silicon diodes will always produce a power dissipation of approximately 600 to 700 milliwatts per ampere load current. A diode bridge (bridge rectifier), which is composed of four diodes, thus produces a power dissipation of approximately 1.2 to 1.4 watts per ampere (RMS) of load current as two diodes are always forward biased in a diode bridge. Particularly for comparably low voltages (e.g. 5 to 15 volts), the power dissipation in the rectifier can be a significant portion of the total power consumption.

To reduce power dissipation in rectifier devices, a technique referred to as active rectification may be used. Thereby, silicon diodes are replaced by power transistors such as power MOS field effect transistors (MOSFETs) or power bipolar junction transistors (BJTs), which have a comparably low on-resistance and thus may produce a significantly lower voltage drop as compared to simple silicon diodes. However, a relatively complex control circuit is usually needed to switch the transistor on and off synchronously to the alternating voltage.

In applications, in which a rectifier is operated with an alternator, the rectifier should have a clamping functionality (e.g. like a Zener diode) to avoid an overvoltage between the battery terminals in order to protect the loads supplied by the battery. Such an overvoltage may occur, for example, when the automotive battery is disconnected from the alternator while the loads remain connected to the alternator.

SUMMARY

A rectifier device is described herein. In accordance with one embodiment, the rectifier device includes a first transistor having a load current path and a diode connected in parallel to the load current path between an anode terminal and a cathode terminal. An alternating input voltage is operably applied between the anode terminal and the cathode terminal. The rectifier device further includes a control circuit that is coupled to a gate terminal of the first transistor and is configured to switch the first transistor on for an on-time period, during which the diode is forward biased. A clamping circuit is coupled to the gate terminal of the first transistor and configured to at least partly switch on the first transistor while the diode is reverse biased and when the level of the alternating input voltage reaches a clamping voltage. The clamping circuit includes a circuit coupled between the cathode terminal and the gate terminal and configured to provide a voltage dependent on a load current passing through the current path of the first transistor.

Further, a method for operating a rectifier device is described herein, wherein the rectifier device includes a first transistor and a diode coupled in parallel between an anode terminal and a cathode terminal. In accordance with one embodiment, the method includes detecting when the diode of the rectifier device is forward biased, switching on the first transistor upon detection that the diode has become forward biased, and switching off the first transistor before the diode again becomes reverse biased. The method further includes monitoring, with a clamping circuit, a voltage between the anode terminal and the cathode terminal and at least partly switching on the first transistor with the clamping circuit while the diode is reverse biased and when the voltage between the anode terminal and the cathode terminal reaches a clamping voltage. The clamping circuit varies the voltage drop between the cathode terminal and a gate of the first transistor dependent on a load current passing through the current path of the first transistor.

BRIEF DESCRIPTION OF THE DRAWINGS

The invention can be better understood with reference to the following description and drawings. The components in the figures are not necessarily to scale, emphasis instead being placed upon illustrating the principles of the invention. Furthermore, in the figures, like reference numerals designate corresponding parts. In the drawings:

FIG. 2 illustrates a power MOSFET which can be used to replace a diode in a rectifier circuit, wherein, in the embodiments described herein, the power MOSFET is reverse conducting when switched on.

DETAILED DESCRIPTION

Figure 1:
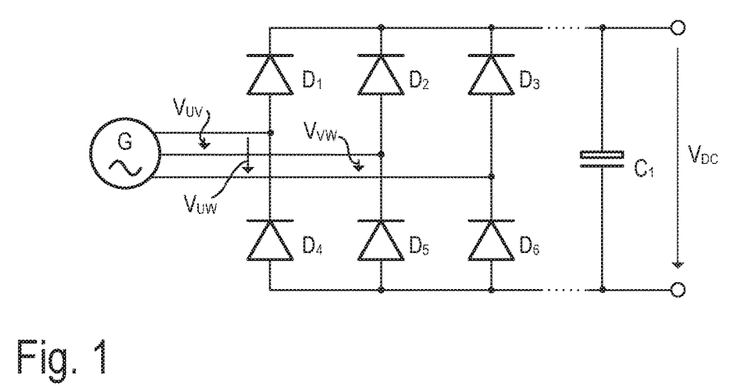
FIG. 1 illustrates, as an illustrative example, a three-phase full-wave rectifier circuit composed of six diodes connected to a three-phase alternator.

As mentioned above, several types of rectifiers exist. FIG. 1 illustrates one exemplary implementation of a three-phase full-wave rectifier, which is built using six diodes $D_1$, $D_2$, $D_3$, $D_4$, $D_5$, $D_6$ connected in a bridge configuration (a so-called three-phase rectifier bridge). FIG. 1 also illustrates a three-phase AC voltage source G which may represent, for example, an electric grid, the secondary sides of a three-phase transformer, an AC generator such as a three-phase alternator used in an automobile, or any other common AC voltage source. The voltage source G provides three-phases, which are connected to the rectifier bridge. The AC voltages between the phases are denoted as $V_{UV}$, $V_{UW}$, and $V_{VW}$. A capacitor $C_1$ may be connected to the output of the rectifier bridge to reduce the ripple of the DC output voltage $V_{DC}$. As mentioned, an automotive battery may be coupled to the rectifier bridge so that the battery can be charged by the generator G.

Silicon diodes usually have a forward voltage of approximately 0.6 to 0.7 volts, and therefore may cause significant power dissipation. To reduce the power dissipation, a silicon diode may be replaced by a rectifier device including a controllable semiconductor switch. In the example illustrated in FIG. 2, the rectifier device 10 includes a power MOS transistor $M_P$ (MOSFET), which has an intrinsic diode $D_R$ (body diode) coupled in parallel to the load current path (drain-source current path) of the power MOS transistor $M_P$. The node and cathode terminals of the rectifier device 10 correspond to anode and cathode of the intrinsic diode and are labelled A and K, respectively. Although a MOSFET is used in the examples described herein, an IGBT with an integrated reverse diode may be used instead. Generally, the rectifier device 10 may have only two terminals and thus may be used as a simple replacement for a normal silicon diode.

Unlike in known active rectifier circuits (also referred to as "synchronous rectifiers"), he power MOS transistor $M_P$ is operated in a reverse conducting mode. Basically, a standard rectifier diode (as used for example in the rectifier bridge of FIG. 1) is replaced by the body diode (see FIG. 2, diode $D_R$) of a power MOS transistor, which can be bypassed by the MOS channel of the power MOS transistor, when the power MOS transistor is activated (i.e. switched on). That is, the power MOS transistor is switched on (which makes the MOS channel conductive), when the body diode is forward biased, thus bypassing the load current path through the body diode. When the diode $D_R$ is reverse biased, the MOSFET $M_P$ is always off during normal operation. In the example depicted in FIG. 2, the rectifier device 10 has only two terminals, a first terminal A (connected to the anode of the body diode $D_R$) and a second terminal K (connected to the cathode of the body diode $D_R$). As will be explained later, the control circuit used to switch the MOSFET $M_P$ on and off may be integrated in the same semiconductor die as the MOSFET $M_P$, and the internal supply of the integrated control circuit may be internally generated from the AC voltage applied at the two terminals A and K. As only two terminals are used by the rectifier device 10, it can readily be used as a replacement for ordinary silicon rectifier diodes to reduce power losses.

Figure 2:
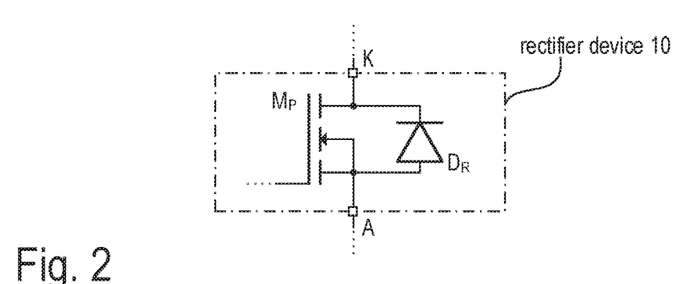
Figure 3:
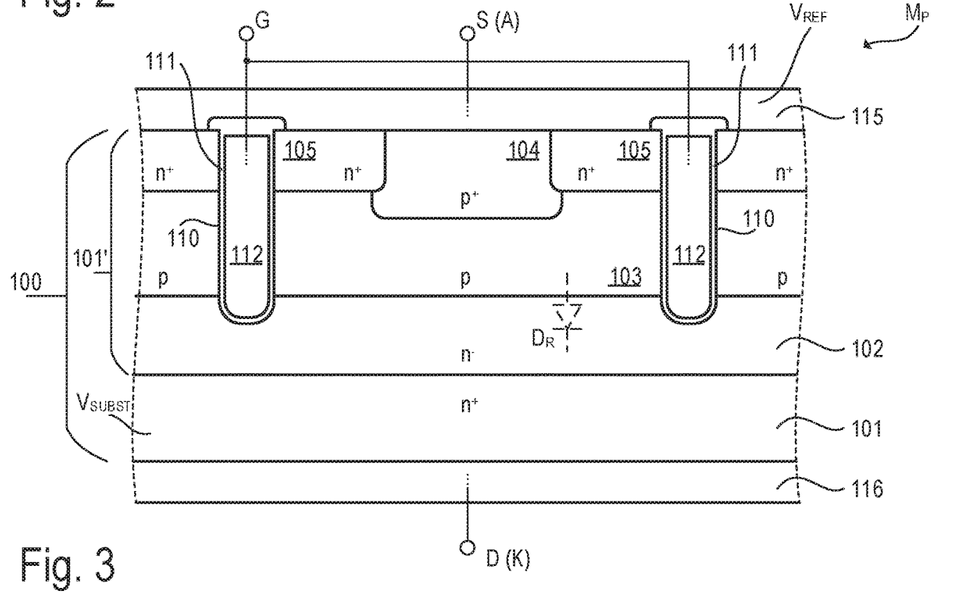
FIG. 3 is a cross-sectional view of a semiconductor body illustrating exemplary implementation of the power MOSFET of FIG. 2.

FIG. 3 illustrates one exemplary implementation of the power MOS transistor $M_P$ of FIG. 2 in a silicon substrate. In the present example, the MOSFET is implemented using a vertical transistor structure composed of a plurality of transistors cells. The term "vertical" is commonly used in the context of power transistors and refers to the direction of the load current path (MOS channel), which extends vertically with respect to a horizontal plane defined by the bottom plane of the semiconductor substrate. The term "vertical" can thus be used to discriminate vertical transistors from planar transistors, in which the load current path (MOS channel) extends parallel to the horizontal plane. In the present example, the vertical MOS transistor is implemented as a so-called trench transistor, which has its gate electrodes arranged in trenches formed in the silicon body. However, other types of vertical power transistors or other types of transistors may be used as well.

Power MOS transistors are usually formed by a plurality of transistors cells coupled in parallel. In the example of FIG. 3, the semiconductor body 100 is essentially formed by a semiconductor substrate 101 (wafer), on which a (e.g. monocrystalline) semiconductor layer 101' is deposited using epitaxial growth. The semiconductor substrate 101 and the semiconductor layer 101' may be doped with dopants of a first doping type, e.g. n-type dopants wherein the concentration of dopants may be much lower in the semiconductor layer 101' (therefore labelled $n^-$) as compared to the highly doped substrate 101 (labelled $n^+$). Trenches 110 are formed in the semiconductor layer by an anisotropic etching process. The trenches 110 extend—from the top surface of the semiconductor body 100—vertically into the semiconductor body 100 and are filled with conductive material (e.g. highly doped polycrystalline silicon) to form gate electrodes 112 within the trenches 110. The gate electrodes 112 are isolated from the surrounding semiconductor body 100 by an oxide layer 111, which is disposed on the inner surfaces of the trenches 110 (e.g. by an oxidation process) before filling them with the mentioned conductive material.

An upper portion of the semiconductor layer 101' is doped with dopants of a second doping type, e.g. p-type dopants, e.g. using a first doping process (e.g. diffusion process of dopants or ion implantation). The resulting p-doped region is usually referred to as the body region 103, whereas the remaining n-doped portion of the semiconductor layer 101' (directly adjoining the substrate 101) forms the so-called drift region 102 of the MOS transistor. As the trenches 110 extend down to the drift region 102, the body region 103 is segmented into a plurality of body regions associated with a respective plurality of transistor cells.

A second doping process (e.g. diffusion process of dopants or ion implantation) is used to form source regions 105. Therefore, the MOS transistor $M_P$ is also referred to as DMOS (double-diffused metal-oxide-semiconductor) transistor. The source regions are doped with dopants of the same type as the substrate 101 (e.g. n-type dopants). The concentration of dopants may be comparably high (therefore labelled n+) but is not necessarily equal to the concentration of dopants in the substrate 101, The source regions 105 extend vertically into the semiconductor body starting from the top surface of the semiconductor body and adjoining the trenches 112. Body contact regions 104, which are doped with dopants of the same type as the body regions 103, may be formed between neighboring trenches 110 in order to allow to electrically contact the body regions 103 at the top surface of the semiconductor body 100. The source regions 105 and the body contract regions 104 are electrically contacted at the top surface of the semiconductor body 100 by the conductive layer 115 (e.g. metal layer) that forms the source electrode S of the power MOS transistor. Thereby the individual transistors cells are electrically connected in parallel. The gate electrodes 112 in the trenches 110 must be isolated from the conductive layer 115 and are also connected to each other, e.g. at the end of the trenches 110 (not visible in FIG. 3). The drain electrode D is thrilled by another conductive layer 116 at the bottom surface of the semiconductor body 100.

The body diode $D_R$ (see also FIG. 3) of the MOSFET is also shown in the cross-sectional view of FIG. 3. It is formed by the p-n junctions at the transitions between the body regions 103 (in each transistor cell) and the drift region 102, The source electrode S (which is electrically connected to the source and body contact regions 105, 104) is therefore also the anode of the diode $D_R$, and the drain electrode D is also the cathode of the diode $D_R$. A transistor designed according to the example of FIG. 3 or similar transistor designs are as such known (sometimes referred to as DMOS transistor) and thus not further explained in detail.

What should be mentioned at this point is that the MOS transistor $M_P$ is not the only component integrated in the substrate. All other circuitry needed to control the switching operation of the MOS transistor $M_P$ can also be integrated in the same semiconductor body 100. The embodiments described herein may be designed as two-terminal rectifier devices (terminals A and K), which have only two external pins and essentially behave like diodes. Unlike a normal silicon diode, the rectifier devices described herein may be designed to have a very low forward voltage as the low-resistive MOS channel bypasses the current path through the body diode $D_R$ while the body diode is forward biased. In the following, the potential at the first terminal A (anode, corresponds to the source electrode of the power MOS transistor $M_P$) is denoted as reference voltage $V_{REF}$, whereas the voltage at the second terminal K (cathode, corresponds to the drain electrode of the power MOS transistor $M_P$) is denoted as substrate voltage $V_{SUBST}$ (voltage present in the substrate 101, see FIG. 3). The reference voltage $V_{REF}$ may be regarded as (floating) ground potential for the circuitry included in the rectifier device 10.

Figure 4:
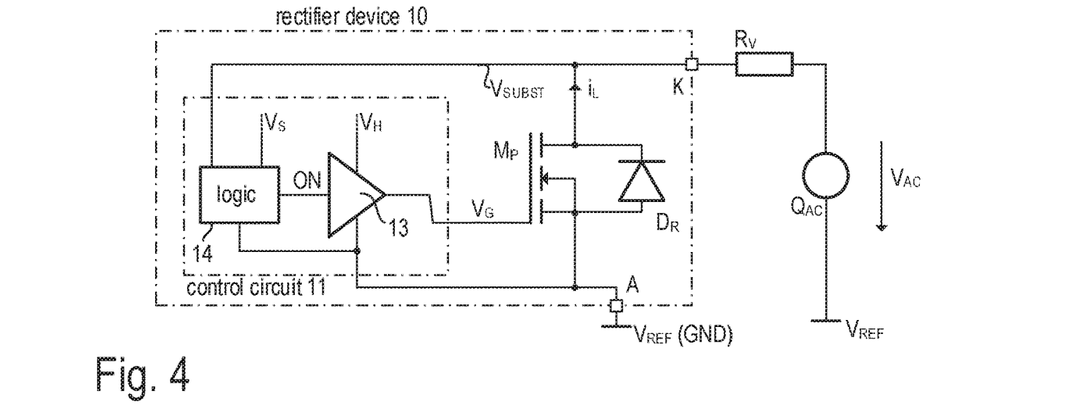
FIG. 4 is a circuit diagram illustrating the power MOSFET of FIG. 2 and a control circuit that is configured to actively switch the MOSFET on when the body diode becomes forward biased.

FIG. 4 illustrates the rectifier device 10 of FIG. 2 in more detail. Accordingly, the rectifier device includes the MOSFET $M_P$ (DMOS transistor), which includes the intrinsic reverse diode $D_R$ (see FIG. 2) as well as a control circuit 11 connected to a gate terminal of the MOS transistor $M_P$. As explained above, the MOS transistor $M_P$ and its intrinsic body diode $D_R$ —and also the control circuit 11—are connected between the first and the second terminals A and K. The electric potential $V_{REF}$ at the first terminal (anode) can be defined as zero volts (0 V) and can thus be regarded as reference or ground potential (ground GND) for all circuitry integrated in the semiconductor body 100. With respect to the reference potential $V_{REF}$, the substrate voltage $V_{SUBST}$ may oscillate from negative values of approximately −0.7 volts minimum (i.e. the negative forward voltage of the body diode $D_R$) to a positive peak value $V_{AC\_MAX}$ of an alternating input voltage applied between the two terminals A and K. In the example of FIG. 4, the rectifier device 10 is supplied by an AC source $Q_{AC}$ via a resistor $R_V$. However, supplying the rectifier device 10 as illustrated in FIG. 4 should be regarded merely as a hypothetical example, which is used to explain the function of the rectifier device 10.

In the present example, the control circuit 11 includes a logic circuit 14, which implements the control function for switching the power MOS transistor on and off, as explained further below with reference to FIGS. 7A and 7B, and a gate driver 13 that generates a gate signal $V_G$ based on the logic signal ON provided by the logic circuit 14. The internal supply voltage $V_S$ may be provided by a supply circuit as shown, for example, in FIG. 6. The supply voltage $V_H$ for the gate driver 13 may be buffered, for example, by a capacitor (not shown). The logic circuit 14 is basically configured to detect that the substrate voltage $V_{SUBST}$ has become negative and trigger the activation the MOS transistor $M_P$ by setting the logic signal ON e.g. to a high level. The logic circuit 14 is basically configured to detect that the substrate voltage $V_{SUBST}$ is about to become again positive and trigger the deactivation of the MOS transistor $M_P$. As mentioned, a negative substrate voltage $V_{SUBST}$ entails a forward biasing of the body diode $D_R$.

Figure 5:
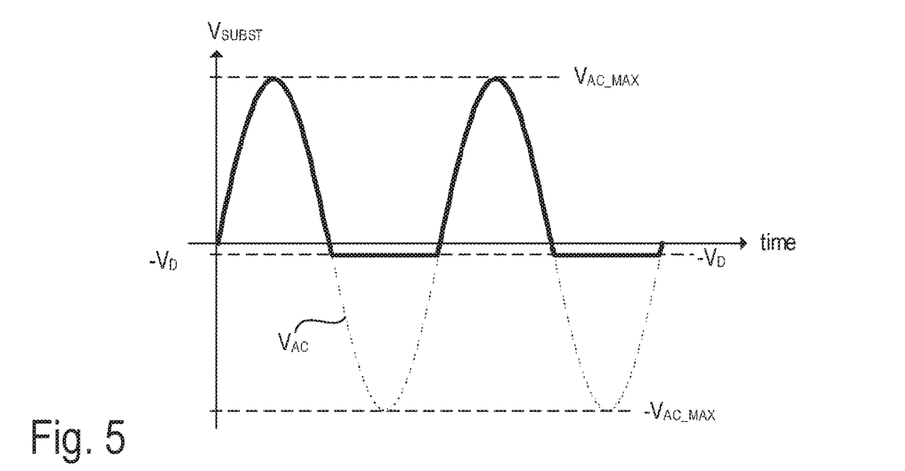
FIG. 5 is a timing diagram illustrating the voltage across the body diode of the MOSFET of FIG. 4, when the MOSFET is connected to a load and not actively switched on while being supplied with an alternating voltage.

FIG. 5 is a timing diagram illustrating the waveform of the substrate voltage $V_{SUBST}$ with respect to the reference potential $V_{REF}$ for the hypothetic case, in which the MOSFET $M_P$ included in the rectifier device 10 is never switched on and, therefore, the load current $i_L$ can only pass the rectifier device 10 via the body diode $D_R$. In this example it is further assumed that an alternating input voltage $V_{AC}$ is applied to a series circuit of the rectifier device 10 and a load (see FIG. 4, resistor $R_V$). Without loss of generality, the reference potential $V_{REF}$ may be defined as 0 V. While the body diode $D_R$ is reverse biased ($V_{SUBST}$>0 V), the substrate voltage $V_{SUBST}$ follows the alternating input voltage $V_{AC}$ and the load current is approximately zero (diode $D_R$ is blocking). While the body diode $D_R$ is reverse biased ($V_{SUBST}$<0V) during normal operation, the substrate voltage $V_{SUBST}$ follows the alternating input voltage $V_{AC}$ as long as the alternating input voltage $V_{AC}$ is higher than the negative forward voltage $-V_D$ of the body diode $D_R$ (e.g. $V_{AC}$>−0.6V). However, when the instantaneous level of the alternating input voltage $V_{AC}$ becomes lower (i.e. more negative) than the negative forward voltage $-V_D$ of the body diode $D_R$ (e.g., $V_{AC}$<−0.6V), the substrate voltage $V_{SUBST}$ will be approximately limited to the negative forward voltage $-V_D$ of the body diode $D_R$ (e.g., $V_{SUBST}$≈−0.6V). In this situation, the diode $D_R$ is forward biased and thus conductive, and the difference between the (negative) substrate voltage and the alternating input voltage $V_{AC}$ is the voltage drop across the load (e.g., resistor $R_V$ in the example of FIG. 4). The load current actually passing through the rectifier device 10, while ($V_{AC} < -V_D$) depends on the load.

As mentioned above, a voltage drop across the rectifier device 10 of approximately 600 to 700 mV (at room temperature) may cause significant power dissipation. To reduce the substrate voltage $V_{SUBST}$ while the body diode $D_R$ is forward biased, the MOS transistor $M_P$ can be switched on to make the MOS channel of the MOS transistor $M_P$ conductive. In this case, the body diode $D_R$ is bypassed via the low-ohmic current path provided by the MOS channel. However, in the time period in which the body diode $D_R$ is reverse biased (i.e. blocking), the MOS transistor should remain switched off. The logic circuit 14 that controls the switching operation of the MOS transistor $M_P$ is included in the control circuit 11 (see FIG. 4). Accordingly, the rectifier device 10 essentially behaves like a diode with a very low forward voltage of approximately 100-200 millivolts.

As shown in FIG. 4, the control circuit 11 is coupled between the two terminals A and K, at which the alternating input voltage is applied (see FIG. 5). However, some circuit components in the control circuit 11 need a DC supply voltage in order to operate properly. Therefore, the control circuit 11 may include at least one supply circuit, which provides an internal supply voltage $V_S$ for supplying various other circuit components of the control circuit 11. Before explaining exemplary implementations of the control circuit 11 and its function in more detail, an exemplary implementation of the internal supply circuit is explained with reference to FIG. 6.

Figure 6:
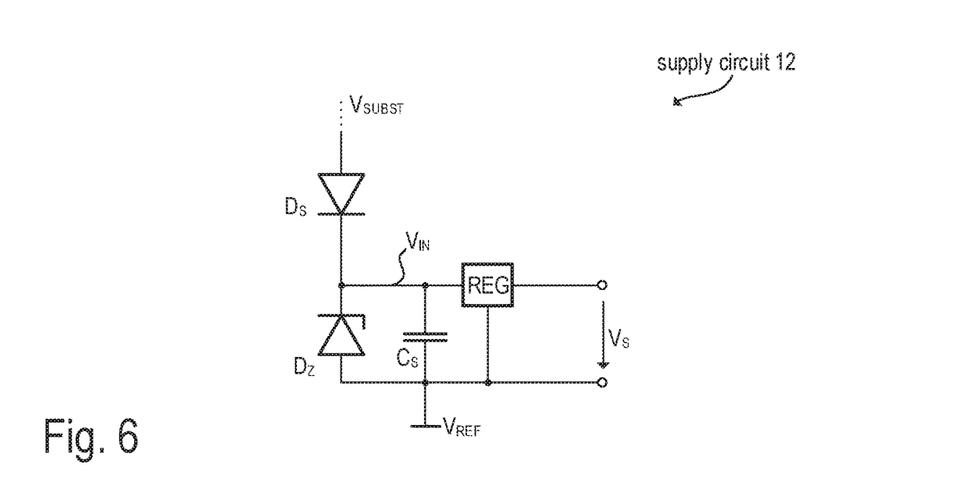
FIGS. 6 is a circuit diagram illustrating an exemplary supply circuit which may be included in the control circuit to generate an internal supply voltage.

The exemplary supply circuit 12 illustrated in FIG. 6 is coupled between the first terminal A (reference potential $V_{REF}$) and the second terminal K (substrate voltage $V_{SUBST}$), which are connected to the source and drain of the power MOS transistor $M_P$, respectively. In this example, a series circuit composed of a diode $D_S$ and a Zener diode $D_Z$ is electrically connected between the substrate (being at substrate voltage $V_{SUBST}$) and the source electrode of the MOS transistor $M_P$ (being at reference potential $V_{REF}$). A buffer capacitor $C_S$ is connected parallel to the Zener diode $D_Z$ as shown in FIG. 6. The capacitor $C_S$ is charged via the diode $D_S$ when the level of the substrate voltage $V_{SUBST}$ is higher than the sum of the voltage $V_{IN}$ across the capacitor $C_S$ and the forward voltage of the diode $D_S$. The Zener diode $D_Z$ limits the capacitor voltage $V_{IN}$ across the capacitor $C_S$ to a maximum value, which is determined by the Zener voltage of the Zener diode $D_Z$. Further, the diode $D_S$ prevents the discharging of the capacitor $C_S$ via the substrate when the substrate voltage $V_{SUBST}$ falls to values lower than the capacitor voltage $V_{IN}$. The capacitor voltage $V_{IN}$ may be supplied as input voltage to a voltage regulator device REG, and the input voltage $V_{IN}$ is buffered by the capacitor $C_S$ while the substrate voltage $V_{SUBST}$ is low. The regulated output voltage of the voltage regulator REG is denoted as $V_S$. The regulated output voltage $V_S$ may be regarded as internal supply voltage that is used to supply any circuitry (e.g. logic circuits such as logic circuit 14, see FIG. 4) integrated in the rectifier device 10.

It is noted that the circuit of FIG. 6 should be regarded as an illustrative example and may also be implemented in various alternative ways. For example, the Zener diode $D_Z$ may be replaced by a any voltage limiting circuit configured to limit the capacitor voltage to a desired maximum. Further, diode $D_S$ may be replaced by a transistor that is able to limit the current passing through it. Dependent on the application, the Zener diode $D_Z$ may be omitted. The capacitor $C_S$ may be replaced by any circuit (e.g. series or parallel circuit of several capacitors) that provides a sufficient capacitance to be able to buffer the input voltage $V_{IN}$ while the substrate voltage $V_{SUBST}$ is too low to charge the capacitor $C_S$. In some implementations, the voltage regulator REG may be substituted by other circuitry that provides a similar function. If the capacitance of the capacitor $C_S$ is high enough to ensure an acceptably low ripple, the regulator REG may be also omitted.

Figure 7A:
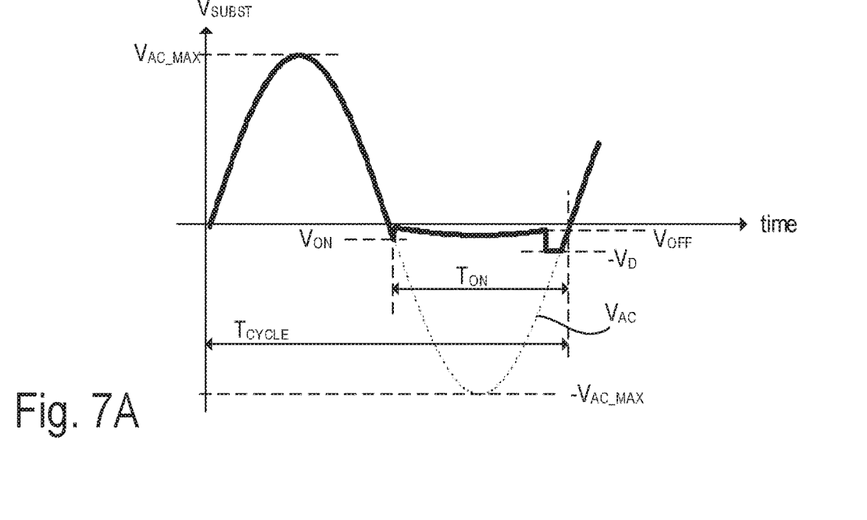
FIGS. 7A and 7B are a timing diagrams illustrating one example of how the MOSFET of FIG. 4 may be switched on and off when supplied with an alternating voltage.
Figure 7B:
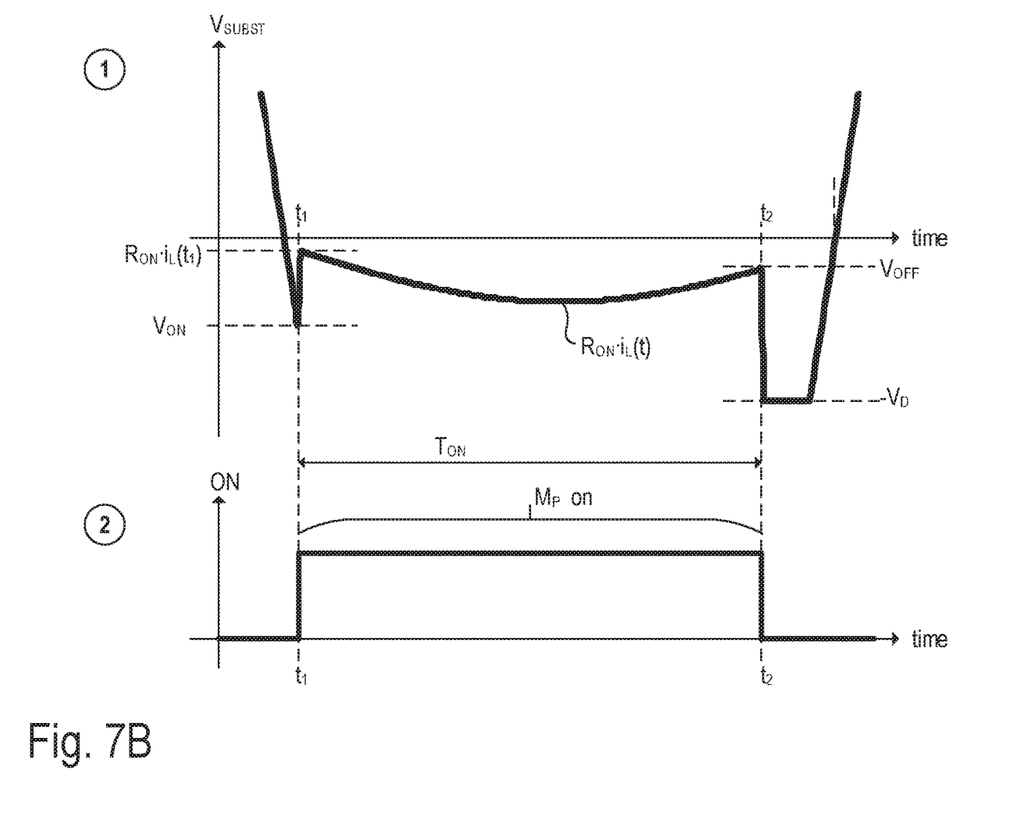

FIGS. 7A and 7B are timing diagrams illustrating the function of one exemplary embodiment of the rectifier device 10 implemented according to the basic example of FIG. 4. In particular, the function of the control logic used to switch on and switch off of the MOS transistor $M_P$ is illustrated by the timing diagrams of FIGS. 7A and 7B. The diagram of FIG. 7A is essentially the same as the diagram of FIG. 5 except that, in the current example, power MOS transistor $M_P$ is switched on when the intrinsic body diode $D_R$ is forward biased in order to bypass the body diode $D_R$ via the activated MOS channel. The bypassing of the body diode $D_R$ results in a voltage drop across the rectifier device 10 which is significantly lower than the forward voltage of a normal diode.

The first diagram of FIG. 7B shows a magnified segment of the waveform shown in FIG. 7A. FIG. 7A shows a full cycle of the substrate voltage $V_{SUBST}$, whereas the first diagram of FIG. 7B only shows approximately the second half of the cycle, during which the substrate voltage $V_{SUBST}$ is negative. The second diagram of FIG. 7B illustrates a simplified waveform of the logic signal ON (see FIG. 4) which triggers the activation/deactivation of the MOS transistor $M_P$ to switch it on and off. As can be seen in FIGS. 7A and 7B, the MOS transistor $M_P$ is switched on when the control circuit 11 detects (by means of logic circuit 14, see FIG. 4) that the substrate voltage $V_{SUBST}$ is negative (i.e. the diode $D_R$ is forward biased). This detection can be made based on various criteria. In the present example, negative threshold voltages $V_{ON}$ and $V_{OFF}$ are used to determine the time instants for switching the MOS transistor $M_P$ on and off (i.e. begin and end of the on-time period $T_{ON}$ of MOS transistor $M_P$). Accordingly, the MOS transistor $M_P$ is switched on when the substrates voltage $V_{SUBST}$ reaches or falls below the first threshold $V_{ON}$, and the MOS transistor $M_P$ is switched off when the substrates voltage $V_{SUBST}$ again reaches or exceeds the second threshold $V_{OFF}$.

In the present example, the condition $V_{SUBST} = V_{ON}$ is fulfilled at time $t_1$ and the control signal ON (see second diagram of FIG. 7B), as well as the corresponding gate voltage $V_G$, are set to a high level to switch the MOS transistor $M_P$ on. When the substrate voltage $V_{SUBST}$ reaches or exceeds the second threshold $V_{OFF}$ at the end of a cycle, the MOS transistor $M_P$ is switched off again. In the present example, the condition $V_{SUBST} = V_{OFF}$ is fulfilled at time $t_2$ and the control signal ON (see bottom diagram of FIG. 7B), as well as the corresponding gate voltage $V_G$, are set to a low level to switch the MOS transistor $M_P$ off. When the MOS transistor $M_P$ is switched off at time $t_2$, the substrate voltage $V_{SUBST}$ may abruptly fall to $-V_D$ before it again rises to positive values at the beginning of the next cycle. It is understood that the waveforms shown in FIG. 7A and 7B are merely an illustrative example and are not to scale.

While the MOS transistor $M_P$ is switched on (i.e. during the on-time period $T_{ON}$), the substrate voltage $V_{SUBST}$ equals $R_{ON} \cdot i_L$, wherein $R_{ON}$ is the on-resistance of the activated MOS channel. In the present example, only two threshold values are used to switch the MOS transistor $M_P$ on and off. However, two or more threshold values may be used to switchon and/or switchoff. In this case the power MOSFET tray be switched on or off (or both) gradually (stepwise) by subsequently switching on/off two or more groups of transistor cells of the power .MOSFET.

Referring back to FIG. 7A, both the first threshold $V_{ON}$ and the second threshold $V_{OFF}$ are negative (note that the reference voltage $V_{REF}$ is defined as zero), but higher than the negative forward voltage $-V_D$ of the body diode $D_R$ of the MOS transistor $M_P$. Further, the second threshold $V_{OFF}$ may be higher (less negative) than the first threshold $V_{ON}$. That is, the condition $-V_D<V_{ON}<V_{OFF}<0$ V is fulfilled in the present example, e.g. $V_{ON}=-250$ mV and $V_{OFF}=-50$ mV, while $-V_D\approx-700$ mV. At this point it should be noted that the cycle time $T_{CYCLE}$ is given by the frequency of the AC input voltage $V_{AC}$.

As can be seen in FIG. 7B, the MOS transistor $M_P$ should only switch on once in each cycle (see FIG. 7A, period $T_{CYCLE}$) of the substrate voltage $V_{SUBST}$, specifically, when the condition $V_{SUBST}=V_{ON}$ is met for the first time. When the condition is met again in the same cycle, a second switch-on of the MOS transistor $M_P$ should be prevented (e.g. at time instant $t_2$, see first diagram of FIG. 7A). Similarly, the MOS transistor $M_P$ should be switched off when the condition $V_{SUBST}=V_{OFF}$ is met at the end of a cycle. If this condition is met earlier during a cycle (e.g. shortly after time $t_1$, if $R_{ON} \cdot i_L(t_1) > V_{OFF}$), an early switch-off of the MOS transistor should be prevented. In order to avoid an undesired early switch-off of the MOS transistor, the control circuit may include a timer that prevents a switch-off for a specific time span (e.g. during the first half of the on-time $T_{ON}$). It is noted that the control logic (e.g. control logic 14, see FIG. 4) that exhibits the behaviors illustrated in FIGS. 7A and 7B may be implemented in numerous different ways. The actual implementation may depend on the application as well as on the semiconductor technology used to manufacture the rectifier device 10. It is understood that a skilled person is able to implement the functionality discussed above with reference to FIGS. 7A and 7B.

Figure 8:
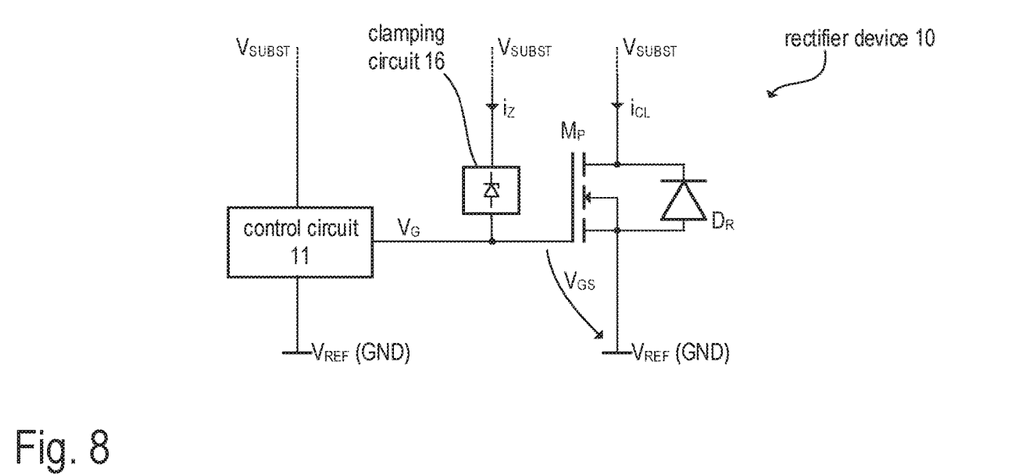
FIG. 8 corresponds to the circuit of FIG. 4 with an additional clamping circuit and with more details of the control circuit.

FIG. 8 is a circuit diagram illustrating one exemplary implementation of rectifier circuit 10 including a MOS transistor $M_P$, a control circuit 11 (see FIG. 4), which is designed to switch the MOS transistor $M_P$ on and off as illustrated in the timing diagrams of FIGS. 7A and 7B (or similar), and a clamping circuit 16. In applications in which a rectifier bridge is connected with an alternator, a voltage limitation (voltage clamp) can be used in order to protect the rectifier devices in the rectifier bridge from an overvoltage. An overvoltage may particularly occur when the electric load is disconnected from the alternator during operation of the alternator (also referred to as a load drop). In an automobile this situation may occur, for example, when the battery is disconnected from the alternator while the alternator is running. The energy generated by the alternator should then be dissipated in a controlled way while limiting the voltage drop across the rectifier devices.

FIG. 8 illustrates one exemplary implementation of the rectifier device 10 with control logic 11 and a clamping circuit 16, which may include a Zener diode. It is understood that more complex clamping circuits may be used, some examples of which are later discussed with reference to FIGS. 11 and 12. Generally the clamping circuit 16 may be coupled. to the gate electrode of the power MOS transistor $M_P$. In one simple example, the clamping circuit 16 may be implemented as a single Zener diode coupled between the gate electrode of the MOS transistor $M_P$ and a circuit node supplied with the substrate voltage $V_{SUBST}$.

Figure 9:
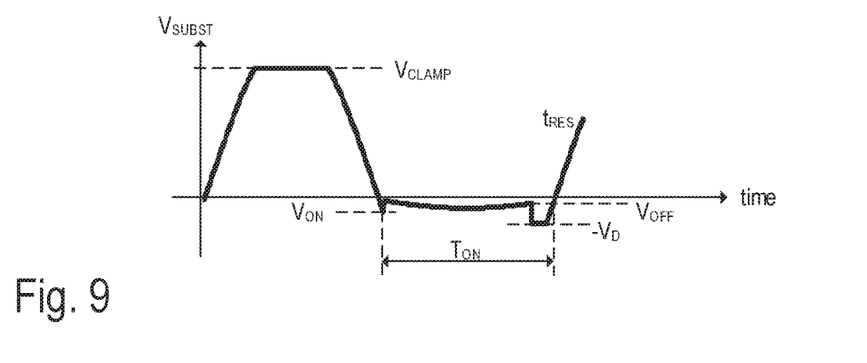
FIG. 9 is a diagram illustrating one exemplary waveform of the across the body diode of the MOSFET of FIG. 4 when the clamping circuit becomes active.

The function and the effect of the clamping circuit 16 is illustrated by the timing diagram of FIG. 9. The diagram of FIG. 9 is substantially the same as the diagram of FIG. 7A except that the substrate voltage $V_{SUBST}$ is clamped to a maximum voltage $V_{CLAMP}$ (clamping voltage). As can be seen from FIG. 9, a voltage clamping can only occur while the intrinsic body diode $D_R$ of the power MOS transistor $M_P$ is reverse biased, i.e. during the positive half-wave of the substrate voltage $V_{SUBST}$. During normal operation, the power MOS transistor $M_P$ is off in this situation and the gate driver 13 (see FIG. 4) keeps the gate-source voltage $V_{GS}$ at a sufficiently low level. The clamping voltage $V_{CLAMP}$ may depend on a Zener voltage $V_Z$ of a Zener diode included in the clamping circuit 16. When the substrate voltage $V_{SUBST}$ reaches the clamping voltage $V_{CLAMP}$, the potential at the gate electrode of MOS transistor $M_P$ is pulled up by the clamping circuit 16, as the voltage drop across the clamping circuit 16 (basically depending on the Zener voltage) is limited. Accordingly, the level of the gate-source voltage $V_{GS}$ increases until it reaches the threshold voltage $V_{GSX}$ of the MOS transistor $M_P$. As a consequence, the MOS transistor $M_P$ becomes (partly) conductive; a load current $i_{CL}$ passes through the power MOS transistor $M_P$ thus preventing a further increase of the substrate voltage $V_{SUBST}$. As can be seen from FIG. 9, the peak power dissipated in the power MOS transistor $M_P$ equals $i_{CL} \cdot V_{CLAMP}$, which produces a significant amount of heat in the active regions of the power MOS transistor $M_P$.

Figure 10:
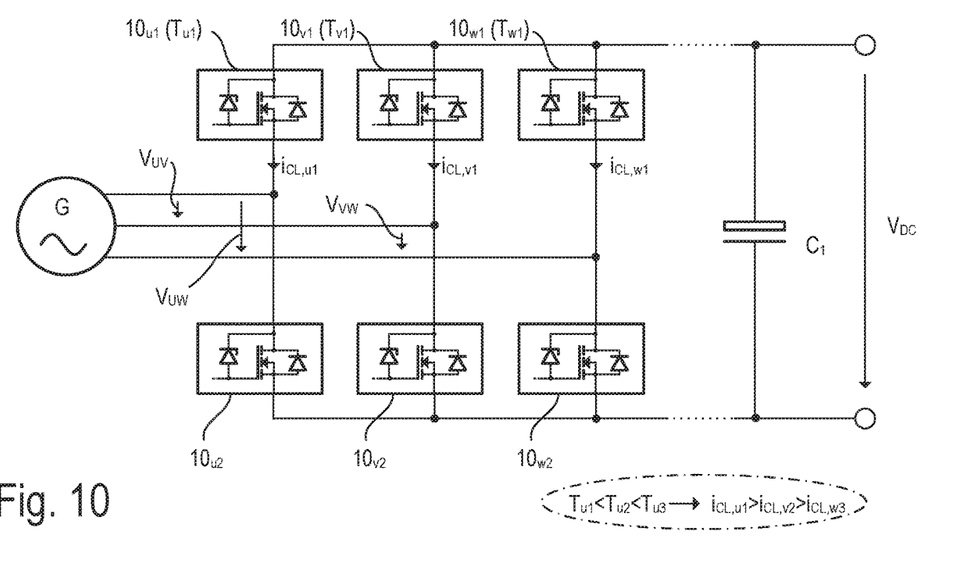
FIG. 10 illustrates an exemplary three-phase full-wave rectifier circuit composed of six rectifier devices connected to a three-phase alternator.

FIG. 10 illustrates an exemplary three-phase full-wave rectifier circuit composed of six rectifier devices $10_{u1}$, $10_{u2}$, $10_{v1}$, $10_{v2}$, $10_{w1}$, and $10_{w2}$ connected to a three-phase alternator G similar to the conventional rectifier shown in FIG. 1. As can be seen in FIG. 10, the rectifier devices $10_{u1}$, $10_{u2}$, $10_{v1}$, $10_{v2}$, $10_{w1}$, and $10_{w2}$ are two-terminal devices (two-poles) an can be used as replacements for standard silicon diodes without further modification of the rectifier bridge circuit. In the present example—when the voltage $V_{UV}$ between the phases U and V is positive and reaches the clamping voltage $V_{CLAMP}$ (e.g. because the battery was disconnected from the alternator), the rectifier devices $10_{u1}$ and $10_{v2}$ are forward biased and the voltage drop across these rectifier devices $10_{u1}$ and $10_{v2}$ is only a view ten millivolts, whereas the rectifier devices $10_{u2}$ and $10_{v1}$ are reverse biased and the voltage limitation is activated due to the integrated clamping circuits (see, e.g., FIG. 4, clamping circuit 16). As a consequence, the load current $i_{CL,v1}$ through the rectifier device $10_{v1}$ causes the power dissipation $V_{CLAMP} \cdot i_{CL,v1}$ and an increase of the temperature $T_{v1}$.

As the alternator rotates, each of the rectifier devices $10_{u1}$, $10_{u2}$, $10_{v1}$, $10_{v2}$, $10_{w1}$, and $10_{w2}$ subsequently run into voltage limitation. If the clamping circuit 16 is implemented using a Zener diode (so that the clamping voltage. $V_{CLAMP}$ is basically determined by the corresponding Zener diode), the clamping voltages $V_{CLAMP}$ may be slightly different for the six rectifier devices $10_{u1}$, $10_{u2}$, $10_{v1}$, $10_{v2}$, $10_{w1}$, $10_{w2}$, due to tolerances in the production process. Different clamping voltages $V_{CLAMP}$ (even if the differences $\Delta V$ are very small) may entail a significantly unequal distribution of the load currents $i_{CL,u1}$, $i_{CL,v1}$, $i_{CL,w1}$, $i_{CL,u2}$, $i_{CL,v2}$, $i_{CL,w2}$, throughout the rectifier devices $10_{u1}$, $10_{u2}$, $10_{v1}$, $10_{v2}$, $10_{w1}$, $10_{w2}$. That is, the load currents $i_{CL,u1}$, $i_{CL,v1}$, $i_{CL,w1}$, $i_{CL,u2}$, $i_{CL,v2}$, $i_{CL,w2}$, passing through the rectifier devices $10_{u1}$, $10_{u2}$, $10_{v1}$, $10_{v2}$, $10_{w1}$, $10_{w2}$ of a rectifier bridge may differ significantly and thus the power dissipated in the rectifier devices will differ correspondingly.

In case of a load drop, the electric power provided by the alternator, which would otherwise be consumed by the load, has to be dissipated by the rectifier bridge operating in clamping mode. It is desired to equally distribute the dissipated power throughout the individual rectifier devices of the rectifier bridge. However, as mentioned, the power dissipation may be significantly different for different rectifier devices and, as a consequence, most of the electric power provided by the alternator may be dissipated by only one or a few rectifier devices of the rectifier bridge, which may thus become significantly hotter than other rectifier devices of the rectifier bridge. Although, an overheating may be avoided by employing heat sinks, local hots spots may still occur and degrade or destroy the rectifier device(s).

Figure 11:
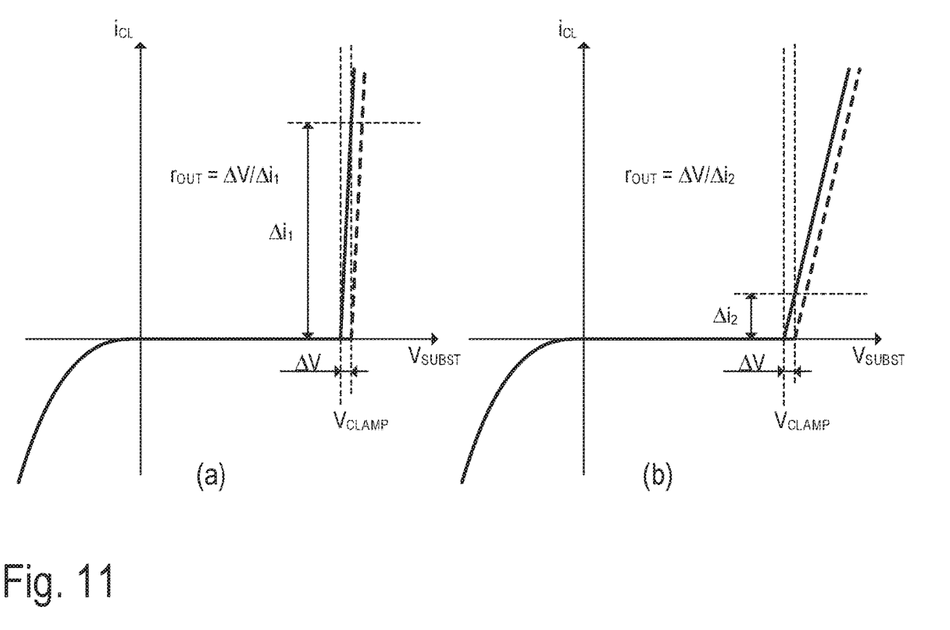
FIG. 11 includes a diagram (a) illustrating the variation of the characteristics curves of Zener diodes due to production tolerances and a diagram (b) illustrating the effect of an increased output resistance of the clamping circuit.

FIG. 11 illustrates how small voltage differences ΔV between the clamping voltages $V_{CLAMP}$ of the rectifier devices of a rectifier bridge may result in comparably high current differences Δi. The left diagram (a) of FIG. 11 illustrates the characteristic curve of a rectifier device when operating clamping mode (i.e. when the intrinsic diode $D_R$ is reverse biased and the AC input voltage exceeds the clamping voltage $V_{CLAMP}$). Accordingly, the rectifier device is off and the clamping circuit 16 causes the MOS transistor to at least partly switch on when the voltage $V_{SUBST}$ across the rectifier device reaches the clamping voltage $V_{CLAMP}$. As the clamping voltage $V_{CLAMP}$ is basically determined by the Zener voltage of a Zener diode, which may vary due to tolerances in the production process, the actual clamping voltages of the rectifier devices may slightly differ from a nominal voltage. In diagram (a) of FIG. 11 the solid line represents the characteristic curve of a first rectifier device having a clamping voltage $V_{CLAMP}$ and the dashed line represents the characteristic curve of a second rectifier device having a clamping voltage $V_{CLAMP}+\Delta V$. As can be seen from FIG. 11, diagram (a) the small voltage difference ΔV causes a significant load current difference $\Delta i_1$ as the (differential) output resistance of a Zener diode is very small, and thus the corresponding (differential) output resistance $r_{OUT}=\Delta V/\Delta i_1$ of the rectifier device (when operating in clamping mode) is also very small. As mentioned, a large current difference $\Delta i_1$ entails a large difference in power dissipation and temperature which may be undesired, as discussed above.

The right diagram (b) illustrates a situation in which the output resistance $r_{out}$ of the rectifier device is higher as compared to the case shown in diagram (a). As can be seen in FIG. 11, the characteristic curves are not so steep as in diagram (a), which entails a lower current difference $\Delta i_2$ for a voltage difference ΔV. Accordingly, the differential output resistance $r_{OUT}=\Delta V/\Delta i_2$ is smaller as in the situation represented by diagram (a). One result that can be derived from FIG. 11 is that increasing the output resistance of the rectifier device leads to an equalization of the load currents passing through the rectifier devices when operating in clamping mode and thus to an equalization of the power dissipation and heat generation. In this context "equalization" does not mean that the load currents passing through the rectifier device become exactly equal but increasing the output resistance of the rectifier devices of a rectifier bridge will make the load currents (as well as power dissipation and heat generation) less unequal.

Figure 12:
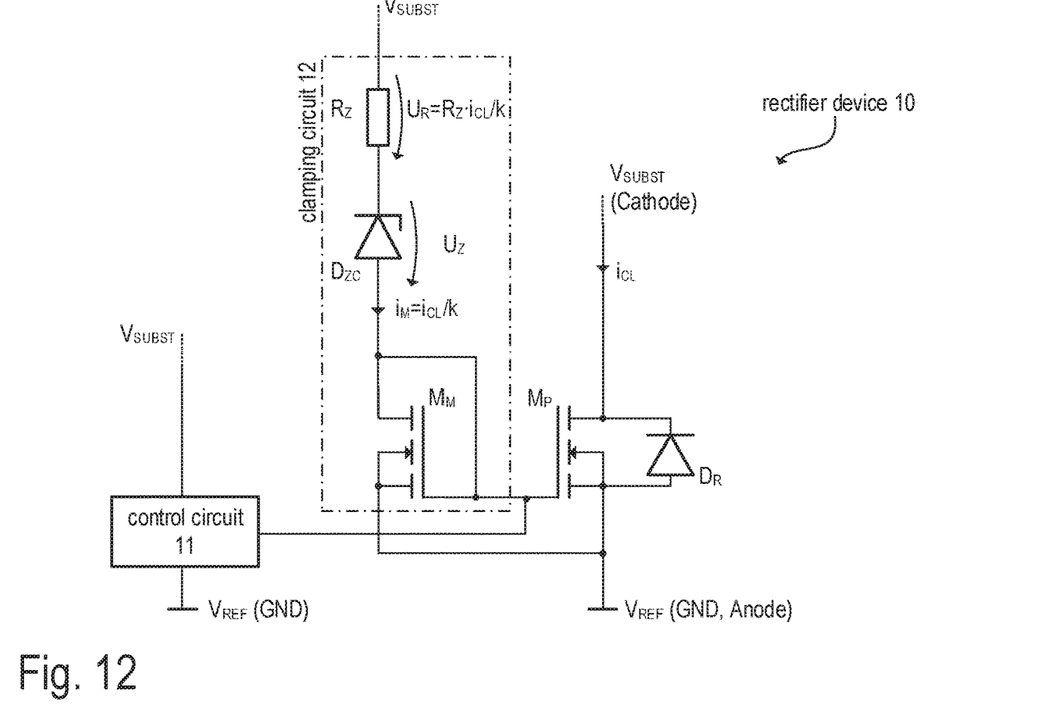
FIG. 12 is a circuit diagram illustrating one exemplary implementation of a clamping circuit having a defined output resistance.

FIG. 12 illustrates one example of a rectifier device 10 including a clamping circuit 16, which has a defined output resistance $r_{OUT}$ when the device operates in clamping mode. In accordance with FIG. 12, the rectifier device includes a transistor $M_P$ (e.g. a power MOS transistor as illustrated in FIG. 3), which has a load current path (drain-source current path) and an intrinsic body diode $D_R$ connected in parallel to the load current path between anode terminal A and a cathode terminal K. During operation, an alternating input voltage is applied between the anode terminal A and the cathode terminal K. As discussed above, the anode terminal may be regarded as ground for the circuitry integrated in the rectifier device and the input voltage is referred to as substrate voltage $V_{SUBST}$ as the cathode terminal is connected to the semiconductor substrate (see, e.g., FIG. 3, substrate 100) in which the rectifier device 10 is integrated. The rectifier device 10 further includes a control circuit 11 that is coupled to the gate terminal of the transistor $M_P$ and is configured to switch the transistor $M_P$ on and off. During normal operation (i.e. when acting as a rectifier diode) the transistor $M_P$ is switched on for an on-time period $T_{ON}$, during which the diode $D_R$ is forward biased (see e.g. FIGS. 7A and 7B). During normal operation the transistor MP is off while the diode $D_R$ is reverse biased. As already mentioned with reference to FIG. 8, the rectifier device 10 includes a clamping circuit 12 which is coupled to the gate terminal of the transistor $M_P$. The clamping circuit is configured to at least partly switch on the transistor $M_P$ while (and although) the diode $D_R$ is reverse biased if the level of the alternating input voltage $V_{SUBST}$ reaches a clamping voltage $V_{CLAMP}$ (see, e.g. FIG. 9). The clamping circuit 12 includes a circuit which is coupled between the cathode terminal K and the gate terminal of transistor $M_P$ and is configured to provide a voltage $U_R$ dependent on a load current $i_{CL}$ passing through the current path of the transistor $M_P$.

In the example of FIG. 12, this circuit providing a voltage $U_R$ dependent on a load current $i_{CL}$ is implemented by a resistor $R_Z$ coupled to a current mirror formed by the (power) transistor $M_P$ and a further transistor $M_M$. The mirror current $i_{CL}/k$ provided by transistor $M_M$ represents the load current $i_{CL}$ passing through transistor $M_P$ and also passes through the resistor $R_Z$, which is connected in series to the drain-source current path of the current mirror output transistor $M_M$. In the present example, the drain current $i_M$ (current mirror output current) is a fraction of the load current $i_{CL}$ passing through the transistor $M_P$, that is $i_M=i_{CL}/k$, wherein k denotes the ratio of the active areas of the transistors $M_P$ and $M_M$. As both transistors may be composed of one or more transistor cells, the factor k may also denote the ratio of the active transistor cells of the transistors $M_P$ and $M_M$.

In the example of FIG. 12 a Zener diode $D_{ZC}$ is connected in series to the resistor $R_Z$ and thus the voltage provided by the series circuit is $U_R+U_Z$ wherein $U_Z$ denotes the Zener voltage of the Zener diode $D_{ZC}$. In this implementation, the mentioned voltage dependent on the load current $i_{CL}$ is $U_R+U_Z$, wherein the voltage $U_R$ linearly depends on the load current $i_{CL}$. That is, $U_R=R_Z \cdot i_{CL}/k$. Accordingly the gate voltage $V_G$ (gate-source voltage) is $$V_G=V_{SUBST}-U_R-U_Z=V_{SUBST}-R_Z \cdot i_{CL}/k-U_Z. \qquad (1)$$

The transistor $M_P$ will become conductive when the gate voltage $V_G$ reaches a threshold voltage $V_{G,TH}$, which—by definition—will be the case when the substrate voltage $V_{SUBST}$ reaches the clamping voltage $V_{CLAMP}$. In other words, the condition $V_G=V_{G,TH}$ is met when $V_{SUBST}=V_{CLAMP}$. As (in a simplified approach) the load current $i_{CL}$ is zero when $V_G \leq V_{G,TH}$, the clamping voltage $V_{CLAMP}$ can be expressed as:

$$V_{CLAMP}=V_{G,TH}+U_Z. \qquad (2)$$

When the substrate voltage $V_{SUBST}$ exceeds clamping voltage $V_{CLAMP}$, the gate voltage $V_G$ will exceed the threshold voltage $V_{G,TH}$ and the transistor $M_P$ will become conductive. However, as the term $-R_Z \cdot i_{CL}/k-U_Z$ (see equation 1) is negative and depends on the load current $i_{CL}$, an increase of the load current will cause a decrease of the gate voltage $V_G$ and thus counteract a further increase of the load current $i_{CL}$ passing through the transistor $M_P$. In other words, the gate voltage of the transistor $M_P$ is reduced in response to an increasing load current $i_{CL}$. This behavior is the same as illustrated by the characteristic curves in diagram (b) of FIG. 11. The differential output resistance may be calculated from equation (1) as $$r_{OUT} = \partial V_{SUBST}/\partial i_{CL} = R_Z \cdot i_{CL} \text{ (if } V_{SUBST} > V_{CLAMP}). \quad (3)$$

Accordingly, if the substrate voltage $V_{SUBST}$ increases by a difference voltage of $\Delta V$, the resulting increase of the load current $i_{CL}$ will be $\Delta i_2 = k \cdot \Delta V / R_z$ (cf, FIG. 11, diagram (b)). As can be seen from equation 3, the output resistance can be designed by choosing an appropriate resistance value for resistor $R_Z$ and does not depend on the characteristics of the Zener diode. It is understood that this is a simplified approach and the contribution of the Zener diode to the total output resistance is in fact not zero but in practice negligible. The output resistance is basically determined by the resistance of resistor $R_Z$. As already discussed with reference to FIG. 11, higher output resistances entail a more uniform distribution of the load currents throughout the rectifier devices connected in a rectifier bridge.

Figure 13:
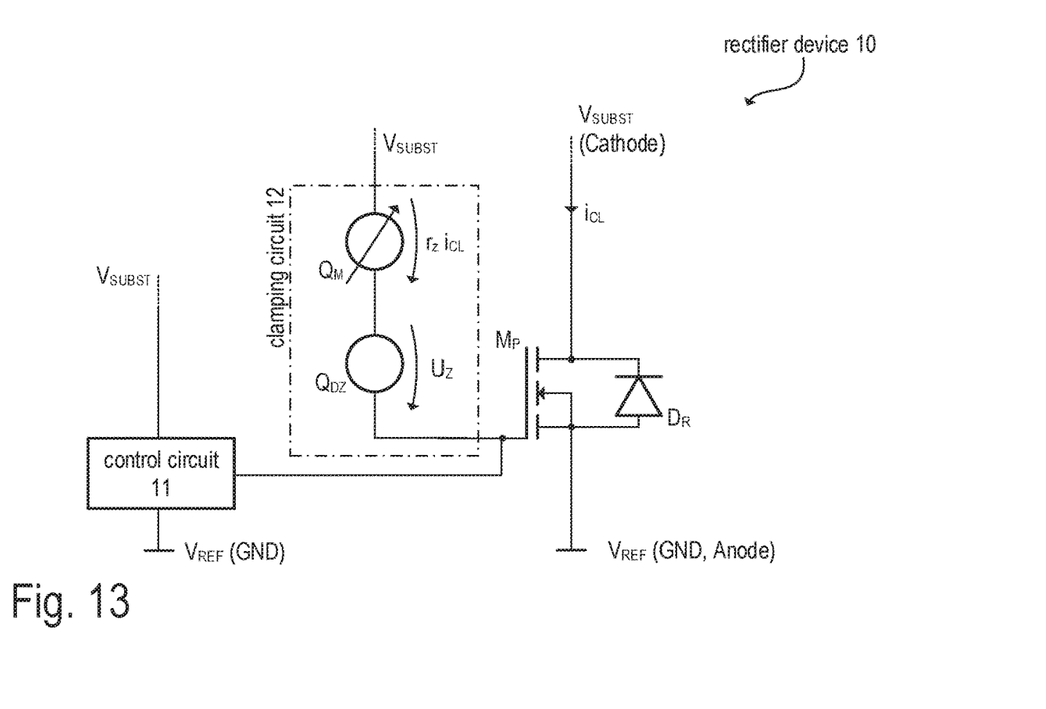
FIG. 13 is a circuit diagram illustrating an example of an equivalent circuit with a controllable voltage source corresponding to the example of FIG. 11.

The example of FIG. 13 may be regarded as a generalization of the implementation of FIG. 12. In fact, the concept used in FIG. 12 may be generalized, as can be seen from equation 1. As the voltage drop $R_Z \cdot i_{CL}/k$ across the resistor $R_Z$ depends on the load current $i_{CL}$, resistor $R_Z$ (in combination with the current mirror $M_P$, $M_M$) could also be regarded as a controllable voltage source, depicted in FIG. 13 as voltage source $Q_M$ providing the voltage $r_{OUT} \cdot i_{CL}$, which is substantially proportional to the load current $i_{CL}$. The Zener voltage $U_Z$ may be regarded as a constant offset voltage provided by a constant voltage source depicted in FIG. 13 as constant voltage source $Q_{DZ}$. Apart from the implementation of the clamping circuit 12, the example of FIG. 13 is the same as the previous example of FIG. 12.

The following numbered examples demonstrate one or more aspects of this disclosure.

Example 1: A rectifier device comprising: a first transistor ($M_P$) having a load current path and a diode ($D_R$) connected parallel to the load current path between an anode terminal (A) and a cathode terminal (K); an alternating input voltage ($V_{SUBST}$) being operably applied between the anode terminal (A) and the cathode terminal (K); a control circuit (11) that is coupled to a gate terminal of the first transistor ($M_P$) and configured to switch the first transistor ($M_P$) on for an on-time period ($T_{ON}$), during which the diode ($D_R$) is forward biased; and a clamping circuit (12) coupled to the gate terminal of the first transistor ($M_P$) and configured to at least partly switch on the first transistor ($M_P$) while the diode ($D_R$) is reverse biased and when the level of the alternating input voltage reaches a clamping voltage ($V_{CLAMP}$), wherein the clamping circuit (12) includes an additional circuit ($Q_M$; $M_M$, $R_Z$) coupled between the cathode terminal (K) and the gate terminal and configured to provide a voltage ($U_R$) dependent on a load current ($i_{CL}$) passing through the current path of the first transistor ($M_P$).

Example 2: The rectifier device of example 1, wherein the additional circuit ($Q_M$; $M_M$, $R_Z$) is a voltage source circuit configured to provide a voltage drop ($U_R$) substantially proportional to the load current ($i_{CL}$).

Example 3: The rectifier device of example 1 or 2, wherein the additional circuit ($Q_M$; $M_M$, $R_Z$) includes a current mirror ($M_M$, $M_P$) and a resistor ($R_Z$).

Example 4: The rectifier device of example 3, wherein the current mirror is formed by the first transistor ($M_P$) and a second transistor ($M_M$) that provides a mirror current ($i_{CK}/k$) that represents the load current ($i_{CL}$), and wherein the resistor ($R_Z$) is coupled to the second transistor ($M_M$) so that the mirror current ($i_{CK}/k$) passes through the resistor ($R_Z$).

Example 5: The rectifier device of any of examples 1 to 4, wherein the additional circuit ($Q_M$; $M_M$, $R_Z$) causes the gate voltage of the first transistor ($M_P$) to be reduced in response to an increasing load current ($i_{CL}$).

Example 6: The rectifier device of any of examples 1 to 5, wherein the clamping circuit (12) further includes at least one Zener diode ($D_{CZ}$) coupled in series to the additional circuit ($Q_M$; $M_M$, $R_Z$).

Example 7: The rectifier device of any of examples 1 to 5, wherein the first transistor ($M_P$) is a MOS transistor, the cathode terminal (K) is a drain terminal of the MOS transistor, and the anode terminal (A) is a source terminal of the MOS transistor.

Example 8: The rectifier device according to any of examples 1 to 7, wherein the control circuit (11) is configured to detect the begin of the on-time period ($T_{ON}$) by detection that the diode ($D_R$) has become conductive.

Example 9: The rectifier device according to any of examples 1 to 8, wherein the control circuit (11) is configured to detect the begin of the on-time period ($T_{ON}$) by detecting that the voltage drop ($V_{SUBST}$) across the diode ($D_R$) has reached a defined first threshold voltage ($V_{ON}$); and wherein the control circuit (11) is configured to detect the end of the on-time period ($T_{ON}$) by detecting that the voltage drop ($V_{SUBST}$) across the load current path of the first transistor ($M_P$) has reached a defined second threshold voltage ($V_{OFF}$).

Example 10: The rectifier device of any of examples 1 to 9, wherein the first transistor ($M_P$) comprises a plurality of transistor cells, and wherein, in order to partly switch on the first transistor ($M_P$), the clamping circuit (12) is configured to only switch on a first group of transistor cells of the plurality of transistor cells, while a second group of transistor cells remains off.

Example 11: A method for operating a rectifier device, wherein the rectifier device comprises a first transistor ($M_P$) and a diode ($D_R$) coupled in parallel between an anode terminal (A) and a cathode terminal (K), the method comprising: detecting when the diode ($D_R$) is forward biased and switching on the first transistor ($M_P$) upon detecting that the diode ($D_R$) has become forward biased, and switching off the first transistor ($M_P$) before the diode ($D_R$) becomes again reverse biased; monitoring, with a clamping circuit (12), a voltage between the anode terminal (K) and the cathode terminal (K); at least partly switching on the first transistor ($M_P$) with the clamping circuit (12), while the diode ($D_R$) is reverse biased and when the voltage between the anode terminal (A) and the cathode terminal (K) reaches a clamping voltage ($V_{CLAMP}$); and varying, with the clamping circuit (12), the voltage drop ($U_R$) between the cathode terminal (K) and a gate of the first transistor ($M_P$) dependent on a load current ($i_{CL}$) passing through the current path of the first transistor ($M_P$).

Example 12: The method of example 11, wherein varying the voltage drop ($U_R$) between the cathode terminal (K) and a gate of the first transistor ($M_P$) comprises increasing the voltage drop ($U_R$) between the cathode terminal (K) and a gate of the first transistor ($M_P$) in response to an increasing load current ($i_{CL}$).

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond— unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. A rectifier device comprising:
a first transistor having a load current path and a diode connected parallel to the load current path between an anode terminal and a cathode terminal, an alternating input voltage being operably applied between the anode terminal and the cathode terminal;
a control circuit that is coupled to a gate terminal of the first transistor and configured to switch the first transistor on for an on-time period, during which the diode is forward biased; and
a clamping circuit coupled to the gate terminal of the first transistor and configured to at least partly switch on the first transistor while the diode is reverse biased and when the level of the alternating input voltage reaches a clamping voltage,
wherein the clamping circuit includes an additional circuit coupled between the cathode terminal and the gate terminal and configured to provide a voltage dependent on a load current passing through the current path of the first transistor, wherein the additional circuit includes a current mirror and a resistor.

2. The rectifier device of claim 1,
wherein the current mirror is formed by the first transistor and a second transistor that provides a mirror current that represents the load current,
and wherein the resistor is coupled to the second transistor so that the mirror current passes through the resistor.

3. The rectifier device of claim 1,
wherein the additional circuit causes the gate voltage of the first transistor to be reduced in response to an increasing load current.

4. The rectifier device of claim 1,
wherein the clamping circuit further includes at least one Zener diode coupled in series to the additional circuit.

5. The rectifier device of claim 1,
wherein the first transistor is a MOS transistor, the cathode terminal is a drain terminal of the MOS transistor, and the anode terminal is a source terminal of the MOS transistor.

6. The rectifier device of claim 1,
wherein the control circuit is configured to detect the begin of the on-time period by detection that the diode has become conductive.

7. The rectifier device according to claim 1,
wherein the control circuit is configured to detect the begin of the on-time period by detecting that the voltage drop across the diode has reached a defined first threshold voltage; and
wherein the control circuit is configured to detect the end of the on-time period by detecting that the voltage drop across the load current path of the first transistor has reached a defined second threshold voltage.

8. The rectifier device of claim 1,
wherein the first transistor comprises a plurality of transistor cells, and
wherein, in order to partly switch on the first transistor, the clamping circuit is configured to only switch on a first group of transistor cells of the plurality of transistor cells, while a second group of transistor cells remains off.

9. A method for operating a rectifier device, wherein the rectifier device comprises a first transistor and a diode coupled in parallel between an anode terminal and a cathode terminal,
the method comprising:
detecting when the diode is forward biased and switching on the first transistor upon detecting that the diode has become forward biased, and switching off the first transistor before the diode becomes again reverse biased;
monitoring, with a clamping circuit, a voltage between the anode terminal and the cathode terminal;
at least partly switching on the first transistor with the clamping circuit, while the diode is reverse biased and when the voltage between the anode terminal and the cathode terminal reaches a clamping voltage; and
varying, with the clamping circuit, the voltage drop between the cathode terminal and a gate of the first transistor dependent on a load current passing through the current path of the first transistor.

10. The method of claim 9,
wherein varying the voltage drop between the cathode terminal and the gate of the first transistor comprises increasing the voltage drop between the cathode terminal and the gate of the first transistor in response to an increasing load current.

11. A rectifier device comprising:
a first transistor having a load current path and a diode connected parallel to the load current path between an anode terminal and a cathode terminal, an alternating input voltage being operably applied between the anode terminal and the cathode terminal;
a control circuit that is coupled to a gate terminal of the first transistor and configured to switch the first transistor on for an on-time period, during which the diode is forward biased; and
a clamping circuit coupled to the gate terminal of the first transistor and configured to at least partly switch on the first transistor while the diode is reverse biased and when the level of the alternating input voltage reaches a clamping voltage,
wherein the clamping circuit includes an additional circuit coupled between the cathode terminal and the gate terminal and configured to provide a voltage dependent on a load current passing through the current path of the first transistor, and
wherein the control circuit is configured to detect the begin of the on-time period by detection that the diode has become conductive.

12. The rectifier device of claim 11,
wherein the additional circuit comprises a voltage source circuit configured to provide a voltage drop substantially proportional to the load current.

13. The rectifier device of claim 11, wherein the additional circuit includes a current mirror and a resistor.

14. The rectifier device of claim 11,
wherein the additional circuit causes the gate voltage of the first transistor to be reduced in response to an increasing load current.

15. The rectifier device of claim 11,
wherein the clamping circuit further includes at least one Zener diode coupled in series to the additional circuit.

16. The rectifier device of claim 11,
wherein the first transistor is a MOS transistor, the cathode terminal is a drain terminal of the MOS transistor, and the anode terminal is a source terminal of the MOS transistor.

17. A rectifier device comprising:
a first transistor having a load current path and a diode connected parallel to the load current path between an anode terminal and a cathode terminal, an alternating input voltage being operably applied between the anode terminal and the cathode terminal;
a control circuit that is coupled to a gate terminal of the first transistor and configured to switch the first transistor on for an on-time period, during which the diode is forward biased; and
a clamping circuit coupled to the gate terminal of the first transistor and configured to at least partly switch on the first transistor while the diode is reverse biased and when the level of the alternating input voltage reaches a clamping voltage,
wherein the clamping circuit includes an additional circuit coupled between the cathode terminal and the gate terminal and configured to provide a voltage dependent on a load current passing through the current path of the first transistor,
wherein the first transistor comprises a plurality of transistor cells, and
wherein, in order to partly switch on the first transistor, the clamping circuit is configured to only switch on a first group of transistor cells of the plurality of transistor cells, while a second group of transistor cells remains off.

18. The rectifier device of claim 17, wherein the additional circuit includes a current mirror and a resistor.

19. The rectifier device of claim 17, wherein the additional circuit comprises a voltage source circuit configured to provide a voltage drop substantially proportional to the load current.

20. The rectifier device of claim 17,
wherein the additional circuit causes the gate voltage of the first transistor to be reduced in response to an increasing load current.

21. The rectifier device of claim 17,
wherein the clamping circuit further includes at least one Zener diode coupled in series to the additional circuit.

22. The rectifier device of claim 17,
wherein the first transistor is a MOS transistor, the cathode terminal is a drain terminal of the MOS transistor, and the anode terminal is a source terminal of the MOS transistor.

23. The rectifier device of claim 17,
wherein the control circuit is configured to detect the begin of the on-time period by detection that the diode has become conductive.

* * * * *